United States Patent [19]

Hüsler et al.

[11] Patent Number: 4,960,746

[45] Date of Patent: Oct. 2, 1990

[54] LIQUID PHOTOINITIATOR MIXTURES

[75] Inventors: Rinaldo Hüsler, Marly; Werner Rutsch, Fribourg; Manfred Rembold, Aesch; Franciszek Sitek, Therwil, all of Switzerland

[73] Assignee: Ciba-Geigy Corporation, Ardsley, N.Y.

[21] Appl. No.: 386,015

[22] Filed: Jul. 26, 1989

Related U.S. Application Data

[63] Continuation of Ser. No. 122,816, Nov. 19, 1987, abandoned.

[30] Foreign Application Priority Data

Nov. 26, 1986 [CH] Switzerland .......................... 4734/86
Feb. 5, 1987 [CH] Switzerland .......................... 416/87

[51] Int. Cl.$^5$ .............................................. B01J 31/02
[52] U.S. Cl. ..................... 502/153; 502/152; 502/155; 430/281
[58] Field of Search ........................ 502/152, 153, 155

[56] References Cited

U.S. PATENT DOCUMENTS

| | | |
|---|---|---|
| 4,318,791 | 3/1982 | Felder et al. . |
| 4,347,111 | 8/1982 | Gehlhaus et al. . |
| 4,559,371 | 12/1985 | Husler et al. . |
| 4,582,862 | 4/1986 | Berner et al. . |
| 4,590,287 | 5/1986 | Riediker et al. . |
| 4,713,401 | 12/1987 | Riediker et al. ..................... 522/65 |

FOREIGN PATENT DOCUMENTS 0138754 4/1985 European Pat. Off. .
0242330 10/1987 European Pat. Off. .

*Primary Examiner*—Patrick P. Garvin
*Attorney, Agent, or Firm*—Luther A. R. Hall

[57] ABSTRACT

Liquid, highly active photoinitiators are obtained by dissolving a solid photoinitiator of a titanocene type in liquid photoinitiators of the type of the α-hydroxy- or α-amino-acetophenones or in a liquid mixture of an α-hydroxy- or α-aminoacetophenone photocuring agent with one or more other photoinitiators.

17 Claims, No Drawings

LIQUID PHOTOINITIATOR MIXTURES

This is a continuation of application Ser. No. 122,816, filed Nov. 19, 1987, now abandoned.

The invention relates to liquid mixtures of photoinitiators. These are solutions of titanocene compounds in liquid photoinitiators of the type of α-hydroxy- and α-amino-acetophenone derivatives. The invention also relates to photocurable compositions which contain such liquid photoinitiator mixtures.

Titanocene compounds with fluoroaromatic radicals are known from EP-A-122,223 as highly active initiators for the photopolymerization of ethylenically unsaturated compounds. Most of the compounds described therein are solid and are sparingly soluble in the usual photopolymerizable compounds or mixtures. There is a need for readily soluble or liquid photoinitiators of high activity. It has now been found that a combination of titanocene initiators with liquid photoinitiators of the type of α-hydroxy- or α-amino-acetophenones leads to liquid initiator mixtures having an extraordinarily high activity.

Photoinitiators of the type of α-hydroxy- and α-amino-acetophenone derivatives are known, for example from US-A-4,347,111, US-A-4,318,791, US-A-4,559,371, US-A-4,582,862 or EP-A-138,754. The compounds described therein include both solid and liquid compounds. According to the invention, the liquid compounds can be used alone, and the solid compounds can be used only in a liquid mixture with other photoinitiators.

The invention therefore relates to a liquid photoinitiator mixture, comprising (A) 70-99.9% by weight of at least one liquid photoinitiator of the formula I or of a liquid mixture of metal-free photoinitiators containing at least one compound of the formula I

in which Ar is a phenyl group which is unsubstituted or is monosubstituted or polysubstituted by halogen, $C_1$-$C_{18}$-alkyl, $C_3$-$C_{12}$-alkenyl, $C_1$-$C_{12}$-alkoxy, allyloxy, phenoxy, $C_1$-$C_{18}$-alkylthio, allylthio, 2-hydroxyethylthio, phenylthio, tolylthio, $C_1$-$C_{12}$-alkylamino, $C_2$-$C_{24}$-dialkylamino, $C_4$-$C_8$-bis-(hydroxyalkyl)-amino, diallylamino, bis-(2-methoxyethyl)amino, morpholino, piperidino or pyrrolidino, $R^1$ and $R^2$ independently of one another are $C_1$-$C_8$-alkyl or $C_1$-$C_4$-alkyl which is substituted by —OH, $C_1$-$C_4$-alkoxy, benzyloxy, —CN, —COO($C_1$-$C_8$-alkyl), ($C_1$-$C_4$-alkyl)—COO—, $C_2$-$C_8$-dialkylamino or morpholino, or $R^1$ and $R^2$ together are $C_3$-$C_9$-alkanediyl, $C_3$-$C_9$-oxa- or -aza-alkanediyl or $C_5$-$C_9$-alkenediyl, X is a group —$OR^3$ or $NR^4R^5$, in which $R^3$ is hydrogen, $C_1$-$C_8$-alkyl, $C_2$-$C_4$-alkyl which is substituted by halogen, —OH or $C_1$-$C_4$-alkoxy, allyl, benzyl, 2-tetrahydropyranyl, trimethylsilyl or phenyldimethylsilyl, $R^4$ and $R^5$ independently of one another are hydrogen, $C_1$-$C_{12}$-alkyl, $C_2$-$C_4$-alkyl which is substituted by —OH, $C_1$-$C_4$-alkoxy, —CN or —COO($C_1$-$C_4$-alkyl), allyl, benzyl or cyclohexyl, or $R^4$ and $R^5$ together are $C_3$-$C_7$-alkylene which can be interrupted by —O— or —N($R^6$)—, $R^6$ being hydrogen, $C_1$-$C_4$-alkyl, allyl, benzyl or $C_2$-$C_4$-hydroxyalkyl, and (B) 0.1-30% by weight of at least one titanocene photoinitiator, selected from ($B_1$) compounds of the formula II

in which $R^7$ and $R^8$ independently of one another are a cyclopentadienyl or indenyl anion which is unsubstituted or is substituted by $C_1$-$C_4$-alkyl, chlorine, phenyl or cyclohexyl, or $R^7$ and $R^8$ together are a divalent bis-cyclopentadienyl anion of the formula III

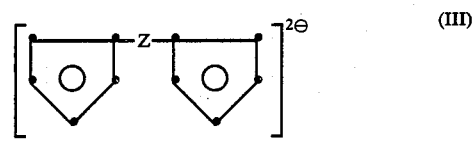

in which Z is methylene, dimethylene or trimethylene, $C_2$-$C_{12}$-alkylidene, $C_5$-$C_7$-cycloalkylidene, -Si($R^{11}$)($R^{12}$)- or -Sn($R^{11}$)$_2$-and $R^{11}$ and $R^{12}$ are $C_1$-$C_{12}$-alkyl, phenyl or benzyl, $R^9$ is the monovalent radical of a 6-membered carbocyclic or 5-membered or 6-membered heterocyclic aromatic ring which is substituted by fluorine in at least one ortho-position relative to the bond to the Ti atom and can also be monosubstituted or polysubstituted by halogen, $C_1$-$C_{12}$-alkyl, $C_1$-$C_{14}$-alkoxy, —O(CH$_2$CH$_2$O)$_{1-20}$-$C_1$-$C_{14}$-alkyl, $C_2$-$C_{10}$-alkoxycarbonyl, aminocarbonyl having up to 12 C atoms or by a primary, secondary or tertiary amino or aminoalkyl group having up to 20 C atoms or a quaternary ammonium or ammonium alkyl group having up to 30 C atoms, $R^{10}$ is as defined for $R^9$ or is $C_2$-$C_{12}$-alkynyl, phenylalkynyl which has 2-5 C atoms in the alkyne radical and is unsubstituted or substituted in the phenyl radical by halogen or $C_1$-$C_{14}$-alkyl, or is halogen or a group —Si($R^{11}$)$_3$, —Si($R^{11}$)$_2$($R^{12}$), —Sn($R^{11}$)$_3$, —OH, $C_1$-$C_{10}$-alkoxy, $C_6$-$C_{10}$-aryloxy, unsubstituted or halogen-substituted $C_2$-$C_6$-acyloxy, -$N_3$, —CN, 'NCO or —NCS, or $R^9$ and $R^{10}$ together are a radical of the formula —Q—Y—Q—, in which Q is a carbocyclic or 5-membered or 6-membered heterocyclic aromatic ring which is bonded to the titanium atom in the 2-position relative to the Y group and is substituted by fluorine in the 3position and, as further substituents, can contain $C_1$-$C_4$alkyl, halogen, $C_1$-$C_4$-alkoxy, di-($C_1$-$C_4$-alkyl)-amino or a quaternary $C_3$-$C_{20}$-ammonium group, Y is methylene, $C_2$-$C_{12}$-alkylidene, $C_5$-$C_7$-cycloalkylidene, a direct bond or a group —$NR^{13}$—, —O—, —S—, —SO—, —SO$_2$—, —CO—, —Si($R^{13}$)($R^{12}$)— or —Sn($R^{11}$)$_2$— and $R^{13}$ is hydrogen, $C_1$-$C_{12}$-alkyl, cyclohexyl, phenyl, tolyl or benzyl, or ($B_2$) compounds of the formula IV

in which $R^7$ and $R^8$ are as defined above, $R^{14}$ is the monovalent radical of a 6-membered carbocyclic or 5-membered or 6-membered heterocyclic aromatic ring which is substituted by —$CF_3$ in at least one ortho-position relative to the bond to the Ti atom and can also be monosubstituted or polysubstituted by halogen, $C_1$-$C_{12}$-alkyl, $C_1$-$C_{14}$-alkoxy, —O($CH_2CH_2O$)$_{1-20}$-$C_1$-$C_{14}$-alkyl, $C_2$-$C_{10}$-alkoxycarbonyl or aminocarbonyl or by a primary, secondary or tertiary amino or aminoalkyl group having up to 20 C atoms or a quaternary ammonium or ammonium alkyl group having up to 30 C atoms, and $R^{15}$ is as defined for $R^{14}$ or is $C_2$-$C_{12}$-alkynyl, phenylalkynyl which has 2–5 C atoms in the alkyne radical and is unsubstituted or substituted in the phenyl radical by halogen or $C_1$-$C_4$-alkyl, or is halogen or a group —Si($R^{11}$)$_3$, —Si($R^{11}$)$_2$($R^{12}$), —Sn($R^{11}$)$_3$, —OH, $C_1$-$C_{10}$-alkoxy, $C_6$-$C_{10}$-aryloxy, unsubstituted or halogen-substituted $C_2$-$C_6$-acyloxy, —$N_3$, —CN, —NCO or —NCS.

A substituted phenyl group Ar in the formula I can, for example, be fluorophenyl, chlorophenyl, bromophenyl, dichlorophenyl, tolyl, xylyl, chlorotolyl, isopropylphenyl, tert.-butylphenyl, 1,1,3,3-tetramethylbutylphenyl, n-octylphenyl, isononylphenyl, n-decylphenyl, n-dodecylphenyl, noctadecylphenyl, allylphenyl, methallylphenyl, methoxyphenyl, ethoxyphenyl, isopropoxyphenyl, butoxyphenyl, octyloxyphenyl, phenoxyphenyl, methylthiophenyl, ethylthiophenyl, butylthiophenyl, dodecylthiophenyl, allylthiophenyl, 2-hydroxyethylthiophenyl, phenylthiophenyl, tolylthiophenyl, methylaminophenyl, dimethylaminophenyl, mono- or di-ethylaminophenyl, mono- or di-butylaminophenyl, mono- or di-octylaminophenyl, mono- or di-dodecylaminophenyl, bis-(2-hydroxyethyl)-aminophenyl, bis-(2-hydroxypropyl)-aminophenyl, diallylaminophenyl, bis-(2-methoxyethyl)-aminophenyl, morpholinophenyl, piperazinophenyl or pyrrolidinophenyl. Preferably, there is a substituent in the 4-position of the phenyl group.

$R^1$ and $R^2$ can, for example, be methyl, ethyl, propyl, butyl, hexyl, octyl, 2-hydroxyethyl, 2-methoxyethyl, hydroxymethyl, ethoxymethyl, 2-butoxyethyl, benzyloxymethyl, 2-cyanoethyl, 2-methoxycarbonylethyl, ethoxycarbonylmethyl, 2-hexyloxycarbonylethyl, 2-acetoxyethyl, propionyloxymethyl, 2butyroyloxyethyl, 2-dimethylaminoethyl, 2-diethylaminopropyl, 2-dibutylaminoethyl, morpholinomethyl or 2-morpholinoethyl. If $R^1$ and $R^2$ together are alkanediyl, oxa- or aza-alkanediyl or alkenediyl, they form, together with the C atom to which they are bound, a saturated or monounsaturated carbocyclic or heterocyclic 5-membered or 6-membered ring which can be substituted by alkyl groups.

Preferably, $R^1$ and $R^2$ are methyl or both together are pentamethylene.

Alkyl or substituted alkyl $R^3$ can, for example, be methyl, ethyl, propyl, isopropyl, butyl, hexyl, octyl, 2-chloroethyl, 4-bromobutyl, 2-hydroxypropyl, 2-hydroxyethyl, 2-methoxyethyl, 2-butoxyethyl or 3-methoxypropyl.

Alkyl or substituted alkyl $R^4$ and $R^5$ can, for example, be methyl, ethyl, propyl, butyl, isopropyl, hexyl, 2-ethylhexyl, octyl, dodecyl, 2-hydroxyethyl, 2-hydroxypropyl, 2-methoxyethyl, 2-isopropoxyethyl, 2-ethoxypropyl, 2-cyanoethyl, 2-methoxycarbonyl-ethyl, 2-ethoxycarbonyl-ethyl, 2-methoxy-carbonyl-propyl or 2-butoxycarbonyl-ethyl. If $R^4$ and $R^5$ together are alkylene, the alkylene can be branched or unbranched and can be interrupted by —O— or —$NR^6$—. In this case, $R^4$ and $R^5$, together with the N atom to which they are bound, form a heterocyclic ring, for example a pyrrolidine, piperidine, methylpiperidine, morpholine, dimethylmorpholine, piperazine, 4-methylpiperazine, 4-isopropylpiperazine, 4allylpiperazine, 4-benzylpiperazine or 4-(2-hydroxyethyl)piperazine ring.

In the compounds of the formulae II and IV, the titanium atom is bound to two π-anions $R^7$ and $R^8$ of the cyclopentadienyl type.

The two anions can be mutually linked covalently via the bridge Z, resulting in a ligand of the formula III.

Examples of such groups Z are —$CH_2$—, —$CH_2CH_2$—,

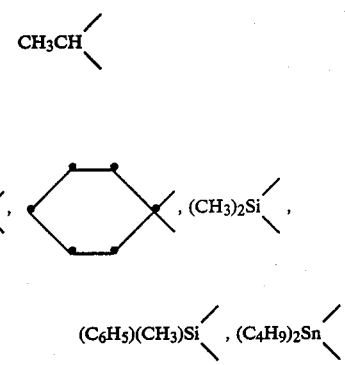

In addition, the titanium in the compounds of the formula II is covalently bound to at least one aromatic radical $R^9$. The aromatic radical can be carbocyclic or heterocyclic and must be substituted by fluorine in the ortho-position relative to the C—Ti bond. Examples of such aromatic radicals are fluorinated benzenes, naphthalenes, furans, thiophenes, pyrroles, pyridines, pyrimidines, pyrazoles, imidazoles, oxazoles or thiazoles, which can also carry yet further substituents such as halogen atoms, alkyl or alkoxy groups, alkoxycarbonyl or aminocarbonyl groups, amino groups or aminoalkyl groups and quaternization products thereof. Examples of such substituents on the aromatic radical are fluorine, chlorine, bromine, methyl, ethyl, iso-propyl, tert.-butyl, n-nonyl or n-dodecyl, methoxy, ethoxy, butoxy, hexyloxy, octyloxy, decyloxy or dodecyloxy, methoxycarbonyl, ethoxycarbonyl, butoxycarbonyl, 2-ethylhexyloxycarbonyl or n-decyloxycarbonyl, aminocarbonyl, butylaminocarbonyl, diethylamino-carbonyl or pyrrolidinocarbonyl, —$NH_2$, —$NHC_4H_9$, —N($CH_3$)$_2$, —N($CH_3$)$_3^{\oplus}CL^{\ominus}$, morpholino, piperidino, —$CH_2NH_2$, —$CH_2N(C_2H_5)_2$, —$CH_2N(C_2H_5)_3^{\oplus}Br^{\ominus}$ or pyrrolidinomethyl.

$R^9$ is preferably a benzene radical which is substituted by fluorine in both ortho-positions.

$R^{10}$ can also be a monovalent fluoro-aromatic radical or it is an alkynyl or phenylalkynyl group which can be correspondingly substituted in the phenyl radical, or $R^{10}$ is an unsubstituted or halogeno-substituted acyloxy, azido, cyano, triorganosilyl or triorganostannyl radical.

Alkynyl $R^{10}$ can, for example, be ethynyl, 1-propynyl, 1-butynyl, 2-hexynyl, 1-octynyl, 1-decynyl or 1-dodecynyl. Unsubstituted or substituted phenylalkynyl $R^{10}$ can, for example, be 2-phenylethynyl, 3-phenylpropynyl, 3-phenylbutynyl, 2-(4-chlorophenyl)-ethynyl or 3-(4-tolyl)-propynyl.

A triorganosilyl or triorganostannyl radical $R^{10}$ can, for example, be trimethylsilyl, triphenylsilyl, dimethylphenylsilyl, methyl-diphenylsilyl, trimethylsilyl, tributylsilyl, trimethylstannyl, tributylstannyl, trioctylstannyl or tridodecylstannyl.

$R^9$ and $R^{10}$ can be linked to form a divalent aromatic radical of the formula —Q—Y—Q—. In the latter, the Q's are carbocyclic or heterocyclic radicals which are bound to the titanium atom in the 2-position relative to the link Y and are substituted by fluorine in the 3-position. Examples of such divalent groups are the following, in which E is —O—, —S— or —NH—:

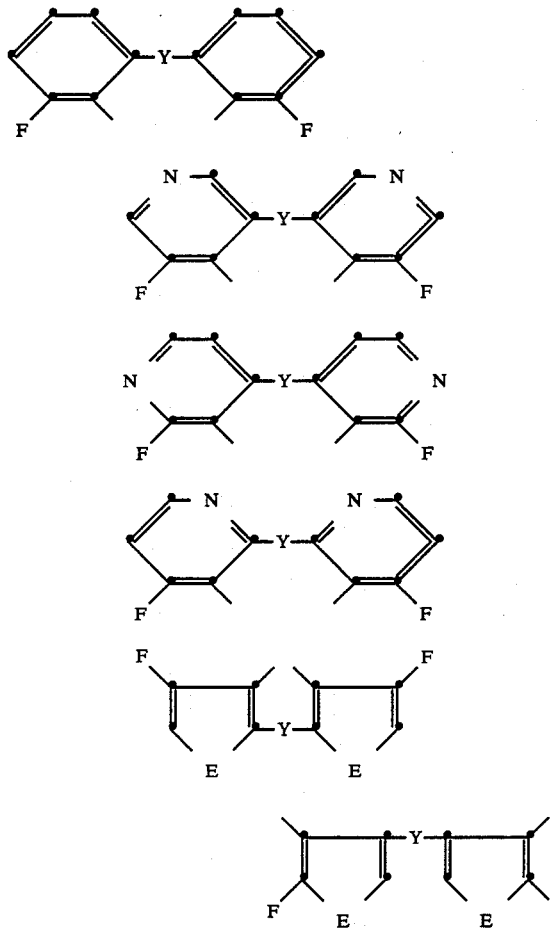

The aromatic radicals Q can carry further substituents, especially halogen, methyl and dimethylamino. The bridge member Y can be a direct bond, a divalent atom or a divalent group. Preferably, Y is —CH₂—,

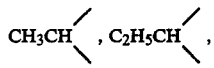

—O— or a direct bond.

Preferably, $R^9$ and $R^{10}$ are identical and are a substituted phenyl radical, especially a 2,6-difluorophenyl radical, which can carry yet further substituents.

Examples of compounds of the formula II are: bis-(cyclopentadienyl)-bis-(pentafluorophenyl)-titanium, bis-(cyclopentadienyl)-bis-(3-bromo-tetrafluorophenyl)titanium, bis-(cyclopentadienyl)-bis-(4-bromo-tetrafluoro- phenyl)-titanium, bis-(cyclopentadienyl)-bis-(2,4,5,6-tetrafluorophenyl)-titanium, bis-(cyclopentadienyl)-bis-(3,5-dichloro-2,4,6-trifluorophenyl)-titanium, bis-(cyclopentadienyl)-bis-(4-morpholino-tetrafluorophenyl)-titanium, bis-(cyclopentadienyl)-bis-(4-[4'-methylpiperazino]-tetrafluorophenyl)-titanium, bis-(cyclopentadienyl)-bis-(4-dibutylaminotetrafluorophenyl)-titanium, bis-(cyclopentadienyl)-bis-(-2,4,6-trifluorophenyl)-titanium, bis-(methylcyclopentadienyl)-bis-(pentafluorophenyl)-titanium, bis-(methylcyclopentadienyl)-bis-(4-morpholino-tetrafluorophenyl)-titanium, bis-(methylcyclopentadienyl)-bis-(4-[4'-methylpiperazino]-tetrafluorophenyl)-titanium, bis-(cyclopentadienyl)-bis-(4-[dimethylaminomethyl]-tetrafluorophenyl)-titanium, bis-(cyclopentadienyl)-bis-(2,3,5,6-tetrafluorophenyl)-titanium, bis-(methylcyclopentadienyl)-bis-(2,3,5,6-tetrafluorophenyl)-titanium, bis-(methylcyclopentadienyl)-bis-(2,4,6-trifluorophenyl)titanium, bis-(cyclopentadienyl)-bis-(2,3,6-trifluorophenyl)-titanium, bis-(methylcyclopentadienyl)-bis-(2,6-diflouro-phenyl)-titanium, bis-(cyclopentadienyl)-bis-(2,6-difluoro-3- methoxy-phenyl)-titanium, bis-(cyclopentadienyl)-bis-(2,6-difluoro-3-propoxy-phenyl)-titanium, bis-(cyclopentadienyl)-bis-(2,6-difluoro-3-hexyloxy-phenyl)-titanium, bis-(cyclopentadienyl)-bis-[2,6-difluoro-3-(2-ethoxy-ethoxy)-phenyl]titanium, bis-(cyclopentadienyl)-bis-(2,6-difluoro-3-methylphenyl)-titanium, bis-(cyclopentadienyl)-bis-(4-methoxy-tetrafluorophenyl) titanium, bis-(cyclopentadienyl)-bis-(4-butoxy-tetrafluorophenyl)-titanium, bis-(cyclopentadienyl)-bis-(4-isopropoxy-tetrafluorophenyl)-titanium, bis-(cyclopentadienyl)-bis-(4-[2-ethylhexyloxy]-tetrafluorophenyl)-titanium, bis-(cyclopentadienyl)-bis-(4-decyloxy-tetrafluorophenyl)-titanium, bis-(cyclopentadienyl)-bis-(4-dodecyloxy-tetrafluorophenyl)-titanium, bis-(cyclopentadienyl)-bis-(4-octyloxy-tetrafluorophenyl)titanium, bis-(methylcyclopentadienyl)-bis-(4-octyloxytetrafluorophenyl)-titanium, bis-(methylcyclopentadienyl)-bis-(4-decyloxy-tetrafluorophenyl)-titanium, bis-(methylcyclopentadienyl)-bis-(4-dodecyloxy-tetrafluorophenyl)-titanium, bis-(methylcyclopentadienyl)-bis-(4-butoxy-tetrafluorophenyl) titanium, bis-(methylcyclopentadienyl)-bis-(4-ethoxy-tetrafluorophenyl)-titanium, bis-(methylcyclopentadienyl)-bis-(4-isopropoxy-tetrafluorophenyl)-titanium, bis-(methylcyclopen-tadienyl)-bis-(4-dibutylamino-tetrafluorophenyl)-titanium, bis-(cyclopentadienyl)-bis-(2,6-difluorophenyl)-titanium, bis-(cyclopentadienyl)-bis-(2,4,5-trifluorophenyl)-titanium, bis-(cyclopentadienyl)-bis-(2,3-difluorophenyl)-titanium, bis-(cyclopentadienyl)-bis-(2,5-difluorophenyl)-titanium, bis-(cyclopentadienyl)-bis-(2,3,4,5-tetrafluorophenyl)-titanium, bis-(methylcyclopentadienyl)-bis-(2,3,4,5-tetra-fluorophenyl)-titanium, bis (methylcyclopentadienyl)-bis-(2,3,4,6-tetrafluorophenyl)-titanium, bis-(methylcyclopentadienyl)-bis-(2,3,6-trifluorophenyl)-titanium, bis-(dimethyl-cyclopentadienyl)-bis-(pentafluorophenyl)-titanium, bis-(cyclopentadienyl)-3,4,5,6,3',4',5',6'-octafluorodiphenylsulfide-2,2'-diyl-titanium, bis-(cyclopenta dienyl)-bis-(4-[4,4-dimethylpiperazino]-tetrafluorophenyl)-titanium diiodide and bis-(cyclopentadienyl)-bis-(4-[trimethylammonium-methyl]-tetrafluorophenyl)-titanium diiodide.

In the compounds of the formula IV, the titanium is bonded, in the same way as in the compounds of the formula II, to two π-anions $R^7$ and $R^8$ of the cyclopentadienyl type. The other two ligands $R^{14}$ and $R^{15}$, however, differ from $R^9$ and $R^{10}$ in that the aromatic radical $R^{14}$ contains a $CF_3$ group in at least one ortho-position. The radical $R^{15}$ can also be an ortho-trifluoromethyl-aromatic or it is alkynyl, phenylalkynyl, halogen, —Si($R^{11}$)$_3$, —Si($R^{11}$)$_2$($R^{12}$), —Sn($R^{11}$)$_3$, —OH, alkoxy, aryloxy, acyloxy, —CN, —$N_3$, —NCO or —NCS, analogously to the radical $R^{10}$. Halogen $R^{15}$ is especially fluorine, chlorine or bromine.

Examples of compounds of the formula IV are: bis-(cyclopentadienyl)-2-(trifluoromethyl)-phenyl-titanium chloride or bromide or fluoride or acetate or trifluoroacetate, bis-(cyclopentadienyl)-bis-(2-trifluoromethyl)-phenyltitanium, bis-(methylcyclopentadienyl)-2-(trifluoromethyl)phenyl-titanium chloride or fluoride or acetate or trifluoroacetate, bis-(cyclopentadienyl)-(2-trifluoromethyl-6-fluorophenyl)-titanium fluoride, bis-(cyclopentadienyl)-2,5-bis-(trifluoromethyl)-phenyl-titanium chloride, bis-(indenyl)2,5-bis-(trifluoromethyl)-phenyl-titanium chloride, bis-(methylcyclopentadienyl)-2-(trifluoromethyl)-phenyl-titanium thiocyanate or isocyanate or cyanide, bis-(cyclopentadienyl)2-(trifluoromethyl)-phenyl-titanium thiocyanate or azide, bis-(cyclopentadienyl)-(2-trifluoromethyl-4-methoxyphenyl)-titanium chloride and bis-(cyclopentadienyl)-bis-(2-trifluoromethyl-4-tolyl)-titanium.

In the mixtures according to the invention, the percentage weight ratio A:B is 70–99.9:0.1–30, and a ratio of 80–99.5% by weight of A:0.5–20% by weight of B is preferred. Quantitatively, component A is thus the main component.

Those mixtures are preferred which comprise (A) 80–99.5% by weight of a liquid photoinitiator or photoinitiator mixture containing at least one compound of the formula I, in which Ar is a phenyl group which is unsubstituted or is monosubstituted or disubstituted by halogen, $C_1$–$C_{12}$-alkyl, $C_1$–$C_8$-alkoxy, allyloxy, phenoxy, $C_1$–$C_8$-alkylthio, 2-hydroxyethylthio, allylthio, phenylthio, $C_1$–$C_8$-alkylamino, $C_2$–$C_{16}$-dialkylamino, diallylamino, $C_4$–$C_6$-bis-(hydroxy-alkyl)amino, bis-(2-methoxyethyl)-amino, morpholino, piperidino or pyrrolidino, $R^1$ and $R^2$ independently of one another are $C_1$–$C_6$-alkyl or $C_1$–$C_4$-alkyl which is substituted by —OH, $C_1$–$C_4$-alkoxy, benzyloxy, -COO($C_1$–$C_4$-alkyl), $C_2$–$C_4$-dialkylamino or morpholino or $R^1$ and $R^2$ together are $C_3$–$C_6$-alkanediyl or $C_5$–$C_7$-alkenediyl, X is a group —$OR^3$ or $NR^4R^5$, in which $R^3$ is hydrogen, $C_1$–$C_4$-alkyl, $C_2$–$C_4$-alkyl which is substituted by —OH or $C_1$–$C_4$-alkoxy, allyl, benzyl, 2-tetrahydropyranyl or trimethylsilyl, and $R^4$ and $R^5$ independently of one another are hydrogen, $C_1$–$C_8$-alkyl, $C_2$–$C_4$-alkyl which is substituted by —OH or $C_1$–$C_4$-alkoxy, allyl, benzyl or cyclohexyl, or $R^4$ and $R^5$ together are $C_3$–$C_7$-alkylene which can be interrupted by —O— or —N($R^6$)—, $R^6$ being hydrogen, methyl or $C_2$–$C_4$-hydroxyalkyl, and (B) 0.5–20% by weight of a compound of the formula II, in which $R^7$ and $R^8$ are a cyclopentadienyl anion which is unsubstituted or substituted by $C_1$–$C_4$-alkyl and $R^9$ and $R^{10}$ are a group of the formula V

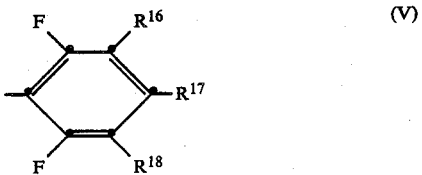

in which $R^{16}$, $R^{17}$ and $R^{18}$ independently of one another are hydrogen, F, Cl, Br, $C_1$–$C_{14}$-alkoxy, —O—($CH_2CH_2O$)$_{18}$—$C_1$–$C_{14}$alkyl, a tertiary amino group or aminomethyl group having 2–20 C atoms or a quaternary ammonium or ammonium-methyl group having 3–24 C atoms, or $R^9$ and $R^{10}$ together are a divalent group of the formula

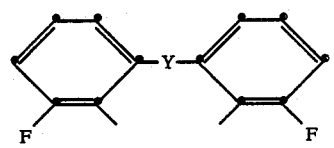

in which Y is as defined above, or 0.5–20% by weight of a compound of the formula IV, in which $R^7$ and $R^8$ are a cyclopentadienyl anion which is unsubstituted or substituted by $C_1$–$C_4$-alkyl and $R^{14}$ is a group of the formula VI

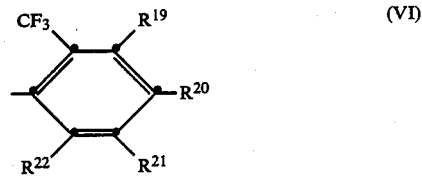

in which $R^9$, $R^{20}$, $R^{21}$ and $R^{22}$ independently of one another are hydrogen, F, Cl, Br or $C_1$–$C_{14}$-alkoxy, and $R^{15}$ is as defined for $R^{14}$ or is F, Cl, Br, CN, —O—CO—$CH_3$, —O—CO—$CF_3$, $N_3$, —NCO or —NCS.

If the compound of the formula I is a liquid compound, component A can consist of only one such compound. If the compound of the formula I is a solid compound, its liquid mixture with either another compound of the formula I or with one or more other metal-free photoinitiators can be used as the component A. Preferably, this second component is a liquid compound or a liquid mixture. However, the second component can also be solid if it forms a liquid eutectic with the first component. An example of such a eutectic of two solid photoinitiators is a 1:1 mixture of 1-hydroxy-cyclohexyl phenyl ketone and benzophenone.

Examples of liquid compounds of the formula I are: 2-hydroxy-2-methyl-1-phenyl-1-propanone, 2-ethyl-2-hydroxy-1-phenyl1-hexanone, 2-hydroxy-2-methyl-1-(4-tolyl)-1-propanone, 1-(4-ethylphenyl)-2-hydroxy-2-methyl-1-propanone, 1-(4-cumyl)-2-hydroxy-2-methyl-1-propanone, 1-(4-tert.-butylphenyl)-2-hydroxy-2-methyl-1-propanone, 1-(4-dodecylphenyl)-2-hydroxy-2-methyl-1-propanone, 2-ethyl-2-hydroxy-1-(4-tolyl)-1-hexanone, 1-(4-tert.-butylphenyl)-2-ethyl-2-hydroxy-1-hexanone, 1-(3,4-dimethylphenyl)-2-hydroxy-2-methyl-1-propanone, 1-(2,4-dimethylphenyl)-2-hydroxy-2-methyl-1-propanone, 1-(2,5-dimethylphenyl)-2-hydroxy-2-methyl-1-propanone, 1-(3-chloro-4-methylphenyl)-2-hydroxy-2-methyl-1-propanone, 1-(4-chlorophenyl)-2-hydroxy-2-methyl-1-propanone, 1-(4-fluorophenyl)-2-hydroxy-2-methyl-1-propanone, 2-ethyl-1-(4-fluorophenyl)-2-hydroxy-1-hexanone, 1-(4-dimethylaminophenyl)-2-ethyl-2-hydroxy-1-hexanone, 2-hydroxy-1-(4-methoxyphenyl)-2-methyl-1-propanone, 2-ethyl-2-hydroxy-1-(4-methoxyphenyl)-1hexanone, 2-hydroxy-2-methyl-1-(4-phenoxyphenyl)-1-propanone, 2-hydroxy-2-methyl-1-(4-phenylthiophenyl)-1-propanone, 2-hydroxy-2-methyl-1-phenyl-1-butanone, 2-ethyl-2-hydroxy-1-phenyl-1-butanone, 2,4-dimethylphenyl 1-hydroxycyclohexyl ketone, 1-hydroxycyclopentyl phenyl ketone, 1-hydroxycyclobutyl phenyl ketone, 1-hydroxy-3,4-dimethyl-3-cyclohexen-1-yl phenyl ketone, 1-hydroxy-4-methyl-3-cyclohexen-1-yl phenyl ketone, 1-hydroxy-3-cyclohexen-1-yl phenyl ketone, 1-hydroxy-2-cyclohexen-1-yl phenyl ketone, 1-(trimethylsilyloxy)-cyclohexyl phenyl ketone, 1-(trimethylsilyloxy)-cyclopentyl phenyl ketone, 1-(trimethylsilyloxy)-cyclobutyl phenyl ketone, 2-methyl-1-phenyl-2-(trimethylsilyloxy)-1-propanone, 2-methyl-1-phenyl-2-(phenyl-dimethyl-silyloxy)-1-propanone, 1-(4-chlorophenyl)-2-methyl-2-(trimethylsilyloxy)-1-propanone, 2-methyl-2-(trimethylsilyloxy)-1-(4-tolyl)-1-propanone, 2-methoxy-2-methyl-1-phenyl-1-propanone, 2-butoxy-2-methyl-1-phenyl-1-propanone, 2-(4-bromobutyloxy)-2-methyl-1-phenyl-1-propanone, 2-allyloxy-2-methyl-1-phenyl-1-propanone, 2-benzyloxy-2-methyl-1-phenyl-1-propanone, 2-(2-methoxyethyloxy)-2-methyl-1-phenyl-1-propanone, 2-(1-ethoxyethyloxy)-2-methyl-1-phenyl-1-propanone, 2-methyl-1-phenyl-2-(tetrahydro-2H-pyran-2-yloxy)-1propanone, 1-methoxycyclohexyl phenyl ketone, 1-methoxycyclohexyl 4-methoxyphenyl ketone, 2-hydroxy-3-methoxy-2-methyl-1-phenyl-1-propanone, 3-benzyloxy-2-hydroxy-2-methyl-1-phenyl-1-propanone, 3-diethylamino-2-hydroxy-2-methyl-1-phenyl-1propanone, 2-hydroxy-2-methyl-3-morpholino-1-phenyl-1-propanone, 3-methoxy-1-methyl-3-piperidyl phenyl ketone, methyl 4-hydroxy-4-methyl-5-phenyl-5-oxo-pentanoate, 2-dimethylamino-2-methyl-1-phenyl-1-propanone, 2-diethylamino-2-methyl-1-phenyl-1-propanone, 2-dipropylamino-2-methyl-1-phenyl-1propanone, 2-dibutylamino-2-methyl-1-phenyl-1-propanone, 2-ethylmethylamino-2-methyl-1-phenyl-1-propanone, 2-methyl-1-phenyl-2-pro-pylmethylamino-1-propanone, 2-methyl-2-methylamino-1-phenyl-1-1-propanone, 2-ethylamino-2-methyl-1-phenyl-1propanone, 2-butylamino-2-methyl-1-phenyl-1-propanone, 2-(2-methylpiperidino)-2-methyl-1-phenyl-1-propanone, 2-methyl-2-pyrrolidino-1-phenyl-1-propanone, 2-methyl-2-piperazino-1-phenyl-1-propanone, 2-diallylamino-2-methyl-1-phenyl-1propanone, 2-bis-(2-methoxyethyl)-amino-2-methyl-1-phenyl-1-propanone, 2-methyl-2-methylamino-1-phenyl-1-butanone, 2-ethyl-2-methyl-amino-1-phenyl-1-butanone, methyl 4-dimethylamino-4-methyl-5-phenyl-5-oxo-pentanoate, 1-dimethylaminocyclohexyl phenyl ketone, 1-methylaminocyclohexyl phenyl ketone, 1-methylamino-cyclopentyl phenyl ketone, 1-ethylaminocyclopentyl phenyl ketone, 1-(4-chlorophenyl)-2-dimethylamino-2-methyl-1-propanone, 1-(4-chlorophenyl)-2-dibutylamino-2-methyl-1-propanone, 1-(4-chlorophenyl)-2-ethylamino-2-methyl-1-propanone, 1-(4-chloro-phenyl)-2-bis-(2-methoxyethyl)-amino-2-methyl-1-propanone, 1-(4-chlorophenyl)-2-methyl-2-(4-methylpiperazino)-1-propanone, 1-(4-chlorophenyl)-2-methyl-2-piperidino-1-propanone, 2-diethylamino-1-(4-fluorophenyl)-2-methyl-1-propanone, 2-diallylamino-1-(4-fluorophenyl)-2-methyl1-propanone, 2-propanone, dimethylamino-1-(4-fluorophenyl)-2-methyl-1-propanone, 2-bis-(2-methoxyethyl)-amino-1-(4-fluorophenyl)-2-methyl-1-1-(4-fluorophenyl)-2-methyl-2-methylamino-1-propanone, 1-(4-fluorophenyl)-2-methyl-2-(4-methylpiperazino)-1-propanone, 1-(4-fluorophenyl)-2-methyl-2-morpholino-1butanone, 1-(4-fluorophenyl)-2-methyl-2-morpholino-1-pentanone, 1-(4-fluorophenyl)-2-ethyl-2-morpholino-1-hexanone, 1-ethylaminocyclo-pentyl 4-tolyl ketone, 1-ethylaminocyclopentyl 2-tolyl ketone, 2- methyl-2-piperidino-1-(4-tolyl)1-propanone, 2-dimethylamino-2-methyl-1-(4-methylthiophenyl)-1-propanone, 2-dimethylamino-2-methyl-1-(4-phenylthiophenyl)-1-propanone, 2-dimethylamino-2-methyl-1-[4-(4-tolylthio)-phenyl]-1-propanone, 2-diethylamino-2-methyl-1-(4-methylthiophenyl)-1-propanone, 2-dibutylamino-2-methyl-(4-methylthiophenyl)-1-propanone, 2-dibutylamino-2-methyl-1-(4-phenylthiophenyl)-1-propanone, 2-bis-(2-methoxyethyl)-amino-2-methyl-1-(4-methylthio-phenyl)-1-propanone, 2-bis-(2-methoxyethyl)amino-2-methyl-1-(4-phenylthiophenyl)-1-propanone, 2-butylamino-2-methyl-1-(4-methylthiophenyl)-1-propanone, 2-methyl-1-(4-methylthiophenyl)-2-pyrrolidino-1-propanone, 2-methyl-1-(4-methylthiophenyl)-2-morpholino-1-butanone, 2-methyl-1-(4-methylthiophenyl)-2-morpholino-1-pentanone, 2-ethyl-1-(4-methylthiophenyl)-2-morpholino-1-hexanone, 2-ethyl-1-(4-methylthiophenyl)-2-piperidino-1-hexanone, 2-ethyl-1-(4-methylthiophenyl)-2-(4-methylpiperazino)-1-hexanone, 2-(2,6-dimethylmorpholin-4-yl)-2-methyl-1-(4-methylthiophenyl)-1-propanone, 2-dimethylamino-1-(4-methoxyphenyl)-2-methyl-1-propanone, 2-dibutylamino-1-(4-methoxyphenyl)-2-methyl-1-propanone, 2-diallylamino-1-(4-methoxyphenyl)-2-methyl-1-propanone, 2-bis-(2-methoxyethyl)-amino-1-(4-methoxyphenyl)-2-methyl-1-propanone, 2-(2-methoxyethyl)-amino-1-(4-methoxyphenyl)-2-methyl-1-propanone, 1-(4-methoxyphenyl)-2-methyl-2-(1-methyl-2-methoxyethyl)-amino-1-propanone, 1-(4-methoxyphenyl)-2-methyl-2-piperazino-1-propanone, 2-(2,4-dimethylmorpholin-4-yl)-1-(4-methoxyphenyl)-2-methyl-1-propanone, 1-(4-methoxy-phenyl)-2-methyl-2-morpholino-1-hexanone, 4-methoxyphenyl 1-mor-pholinocyclohexyl ketone, 4-methoxyphenyl 1-methylaminocyclopentyl ketone, 1-(4-allyloxyphenyl)-2-methyl-2-morpholino-1-propanone, 2-methyl-1-(4-phenoxyphenyl)-2-piperidino-1-propanone, 1-(4-methoxyphenyl)-2-methyl-2-piperidino-1-propanone, 2-diethylamino-1-(4-diethylaminophenyl)-2-methyl-1-propanone, 2-diallylamino-1-(4-diallylaminophenyl)-2-methyl-1-propanone, 2-methylamino-2-methyl-1-(4-morpholinophenyl)-1-propanone, 2-dimethylamino-1-(4-dimethylaminophenyl)-2-methyl-1-pentanone, 2-methyl-2-morpholino-1-(4-morpholinophenyl)-1-pentanone, 2-ethyl-2-morpholino-1-(4-morpholinophenyl)-1-hexanone, 2-bis-(2-methoxyethyl)-amino-1-(4-dimethylaminophenyl)-2-methyl-1-propanone, 2-bis-(2-methoxyethyl)-amino-1-(4-morpholinophenyl)-2-methyl-1-propanone and 1-[4-(bis-(2-methoxyethyl)-amino)-phenyl]-2-methyl-2-morpholino-1-propanone.

Such liquid compounds of the formula I can be used alone or as a mixture with another compound of the formula I or as a mixture with another photoinitiator as the component A. The use of a mixture can have the advantage that the solidification point of component A is lowered thereby or that the activity is increased.

The use of a mixture as the component A is important especially if it is desired to use a solid compound of the formula I. Examples thereof are liquid mixtures of a compound of the formula I and a compound of the formula VII

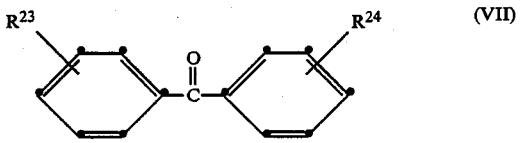

(VII)

in which $R^{23}$ and $R^{24}$ independently of one another are hydrogen, $C_1$–$C_{12}$-alkyl, $C_1$–$C_4$-alkoxy, $C_1$–$C_4$-alkylthio, $C_2$–$C_4$-hydroxyalkoxy, $C_2$–$C_4$-hydroxyalkylthio, halogen, $C_2$–$C_{10}$-alkoxycarbonyl or $C_2$–$C_8$-dialkylamino. The compounds of the formula VII by themselves are known as photoinitiators.

Examples of such compounds of the formula VII are: benzophenone, 2-methylbenzophenone, 4-methylbenzophenone, 4-isopropylbenzophenone, 4-chlorobenzophenone, 2,2'-dichlorobenzophenone, 4-methoxybenzophenone, 4-ethoxybenzophenone, 4-(2-hydroxyethylthio)-benzophenone, 4-(2-hydroxypropoxy)benzophenone, 4-dimethylaminobenzophenone, 4,4'-bis-(dimethylamino)-benzophenone, 4-ethoxycarbonylbenzophenone or 4-tert.butoxycarbonylbenzophenone. Liquid mixtures of a compound of the formula I and benzophenone are preferred.

The weight ratio of the compound of the formula I and the compound of the formula VII is preferably 0.8:1 to 1:0.8.

Further examples are liquid mixtures of a compound of the formula I and a 2,4,6-tri-($C_1$–$C_4$-alkyl)-benzophenone, for example 2,4,6-trimethylbenzophenone, or mixtures of a compound of the formula I, a 2,4,6-tri-($C_1$–$C_{14}$-alkyl)-benzophenone and benzophenone.

Other examples of mixtures are those of a compound of the formula I and a compound of the formula VIII

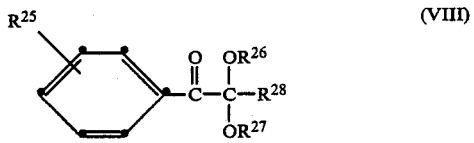

(VIII)

in which $R^{25}$ is halogen, $C_1$–$C_4$-alkyl or $C_1$–$C_4$-alkoxy, $R^{26}$ and $R^{27}$ are $C_1$–$C_6$-alkyl, $C_3$–$C_4$-alkenyl, $C_7$–$C_{10}$-phenylalkyl or $C_2$–$C_4$-alkyl which is substituted by halogen, $C_1$–$C_4$-alkoxy, $C_2$–$C_8$-dialkylamino, morpholino or piperidino, or $R^{26}$ and $R^{27}$ together are $C_2$–$C_{12}$-alkanediyl or 2-butene-1,4-diyl and $R^{28}$ is hydrogen, $C_1$–$C_8$-alkyl, $C_5$–$C_8$-cycloalkyl, phenyl or phenyl which is substituted by halogen, $C_1$–$C_4$-alkyl or $C_1$–$C_4$-alkoxy.

The compounds of the formula VIII are known as photoinitiators. Examples of these are 2,2-dimethoxyacetophenone, 2,2-diethoxyacetophenone, 2,2-dibutoxyacetophenone, 2,2-dimethoxypropiophenone, 2,2-diethoxy-p-chloroacetophenone, 2,2-dimethoxy-2-phenylacetophenone, 2,2-diethoxy-2-phenylacetophenone, 2,2-dimethoxy-2-(4-methylphenyl)-p-methylacetophenone, 2-benzoyl-2-phenyl-4,7-dihydro-1,3-dioxepin or 2-benzoyl-2-phenyl-1,3-dioxolane.

Liquid mixtures of a compound of the formula I and 2,2-dimethoxy-2-phenylacetophenone or 2,2-diethoxy-2-phenylacetophenone are preferred.

The weight ratio of the compound of the formula I and the compound of the formula VIII is preferably 2:1 to 1:2.

The component A can also consist of a liquid mixture of two compounds of the formula I. Examples of this are 1-hydroxycyclohexyl phenyl ketone and 2-hydroxy-2-methyl-1-phenyl-1-propanone in a 1:1 ratio or 2-methyl-1-(4-methylthiophenyl)-2-morpholino-1-propanone and 2-hydroxy-2-methyl-1-phenyl-1-propanone in a 2:8 ratio or liquid isomer mixtures formed in the preparation of compounds of the formula I.

Component A can also consist of a liquid mixture of one compound of the formula I with two other photoinitiators, for example a mixture of one compound of the formula I, one compound of the formula VII and one compound of the formula VIII.

Amongst the compounds of the formula I, those are preferred in which Ar is phenyl or phenyl which is substituted by chlorine, fluorine, $C_1$–$C_{12}$-alkyl, methoxy, methylthio, dimethylamino, diethylamino, bis-(2-methoxyethyl)-amino, morpholino, piperidino or pyrrolidino, $R^1$ and $R^2$ independently of one another are $C_1$–$C_4$-alkyl or $C_1$–$C_4$-alkyl which is substituted by —OH or $C_1$–$C_4$-alkoxy, or $R^1$ and $R^2$ together are $C_4$–$C_6$-alkanediyl or $C_5$–$C_7$-alkenediyl, and X is —OH or —NR$^4$R$^4$ and R$^5$ being $C_1$–$C_4$-alkyl, allyl or 2-methoxyethyl or R$^4$ and R$^5$, together with the nitrogen atom, being pyrrolidino, piperidino, morpholino, piperazino or 4-methylpiperazino.

Those compounds of the formula I are particularly preferred in which Ar is phenyl, p-tolyl, p-cumyl, 4-dodecylphenyl, 4-chlorophenyl or 4-methoxyphenyl, $R^1$ and $R^2$ independently of one another are $C_1$–$C_4$-alkyl or $R^1$ and $R^2$ together are tetramethylene or pentamethylene and X is a hydroxyl group, as well as those compounds of the formula I in which Ar is phenyl, p-tolyl, p-cumyl, 4-chlorophenyl, 4-methoxyphenyl, 4-methylthiophenyl, 4-dimethylaminophenyl, 4-diethylaminophenyl, 4-bis-(2-methoxyethyl)-aminophenyl, 4-morpholinophenyl or 4-piperidinophenyl, $R^1$ and $R^2$ independently of one another are $C_1$–$C_4$-alkyl and X is methylamino, dimethylamino, ethylamino, diethylamino, bis-(2-methoxyethyl)-amino, piperidino, pyrrolidino, morpholino, piperazino or 4-methylpiperazino.

The component B used is preferably either a compound of the formula II, in which $R^7$ and $R^8$ are a cyclopentadienyl anion or methylcyclopentadienyl anion and $R^9$ and $R^{10}$ are a group of the formula V, in which either a) R16 is H, F, Cl or Br, $R^{17}$ is fluorine, $C_1$–$C_{14}$-alkoxy or -O(CH$_2$CH$_2$O)$_{1-6}$–$C_1$–$C_{14}$-alkyl and $R^{18}$ is H, Cl or Br, or b) $R^{18}$ is H, F, Cl or Br and $R^{16}$ and $R^{17}$ are H, Cl, Br, $C_1$–$C_{14}$-alkoxy, or -O(CH$_2$CH$_2$O)$_{1-6}$–$C_1$–$C_{14}$-alkyl a tertiary amino or aminomethyl group or a quaternary ammonium or ammonium methyl group, or a compound of the formula IV, in which $R^7$ and $R^8$ are a cyclopentadienyl anion or methylcyclopentadienyl anion, $R^{14}$ is 2-(trifluoromethyl)-phenyl or 6-fluoro-2-(trifluoromethyl)-phenyl and $R^{15}$ is as defined for $R^{14}$ or is F, Cl, Br, CN, N$_3$, —O——CO—CH$_3$, —O—CO—CF$_3$, —NCO or —NCS.

Examples of particularly preferred initiator mixtures according to the invention are those which consist of 40–50% by weight of 1-hydroxycyclohexyl phenyl ketone, 40–50% by weight of benzophenone and 5–20% by weight of a compound of the formula II or IV, and those which consist of 25–30% by weight of 1-hydroxycyclohexyl phenyl ketone, 25–30% by weight of benzophenone, 35-40% by weight of 2,2-dimethoxy-2-phenylacetophenone and 2-15% by weight of a compound of the formula II or IV.

To prepare the initiator mixtures according to the invention, component B is stirred into component A until a clear solution has formed. Preferably, the dissolution is carried out with slight heating to about 40°-60° C. The dissolution should take place in dark rooms illuminated by red light, since the dissolved titanocenes are sensitive to short-wave sunlight (up to 600 nm). The solutions thus obtained are stable for a long time in the dark.

Under irradiation by short-wave light, the initiator mixtures according to the invention are capable of initiating the free-radical polymerization of ethylenically unsaturated compounds. They can therefore be used for curing photopolymerizable compounds. The photopolymerizable compounds are ethylenically monounsaturated or polyunsaturated compounds.

Examples of monounsaturated compounds are acrylates or methacrylates of monohydric alcohols, acrylamides and similar acrylic acid derivatives, for example methyl acrylate, ethyl acrylate, butyl acrylate, isooctyl acrylate or hydroxyethyl acrylate, methyl methacrylate or ethyl methacrylate, acrylonitrile, acrylamide and N-butyl-methacrylamide, as well as vinyl compounds and allyl compounds, for example vinyl acetate, vinyl stearate, N-vinylpyrrolidone, vinylidene chloride, vinylbenzene or allyl acetate.

Examples of polyunsaturated compounds are acrylates, methacrylates or itaconates of polyols, for example ethylene glycol diacrylate, diethylene glycol dimethacrylate, triethylene glycol diacrylate, 1,4-butanediol diacrylate, 1,2-propanediol diacrylate, 1,3-butanediol dimethacrylate, neopentyl glycol diacrylate, trimethylolpropane di(meth)acrylate, trimethylolethane di(meth)acrylate, glycerol diacrylate and triacrylate, pentaerythritol diacrylate, triacrylate and tetraacrylate or dimethacrylate, trimethacrylate and tetramethacrylate, dipentaerythritol tetraacrylate, pentaacrylate and hexaacrylate or tetramethacrylate, pentamethacrylate and hexamethacrylate or tetraitaconate, pentaitaconate and hexaitaconate, sorbitol tetraacrylate, sorbitol hexamethacrylate, diacrylates or dimethacrylates of 1,4-cyclohexanediol, 1,4dimethylolcyclohexane, bisphenol A, 2,2-bis-(4-hydroxyphenyl)propane, of polyethylene glycols or of oligoesters or oligourethanes with terminal hydroxyl groups. The polyunsaturated monomers used can also be acrylamides, for example methylenebisacrylamide, hexamethylene-1,6-bisacrylamide, diethylenetriamine-tris-methacrylamide, bis-(methacrylamidopropoxy)ethane or 2-acrylamido-ethyl acrylate. Examples of polyunsaturated vinyl and allyl compounds are divinylbenzene, ethylene glycol divinyl ether, diallyl phthalate, allyl methacrylate, diallyl maleate, triallyl isocyanurate or triallyl phosphate.

Polymeric or oligomeric polyunsaturated compounds can also be photopolymerized with crosslinking, for example unsaturated polyesters and copolyesters of maleic acid and fumaric acid, (meth)acrylates of polyvinyl alcohol or homopolymers or copolymers of butadiene or isoprene. Further polyunsaturated components which can be used are the reaction products of polyepoxides with acrylic acid or methacrylic acid. The polyepoxides used here are predominantly the commercially available epoxide resin precursors which are obtainable in various molecular weights.

In most cases, mixtures of such unsaturated compounds are used for photopolymerization in order to be able to vary the properties of the polymers for the desired intended use. Examples are mixtures of diacrylates with polyester-acrylates or polyurethane-acrylates, mixtures of monoacrylates, diacrylates and triacrylates, mixtures of unsaturated maleic acid polyesters with styrene or other mixtures of polymericoligomeric unsaturated compounds with diacrylates, triacrylates or tetraacrylates. The mixtures can consist of two, three or even more unsaturated components.

Photocurable compositions, such as are used for the various purposes, contain in most cases a number of other additives apart from the photopolymerizable compounds and the photoinitiators. Thus, it is customary in many cases to add thermal inhibitors which are intended, in particular to provide protection from premature polymerization during the preparation of the mixtures by mixing of the components. For example hydroquinone, hydroquinone derivatives, p-methoxyphenol, β-naphthols or sterically hindered phenols, for example 2,6-di-(tert-butyl)-p-cresol, are used for this purpose. Moreover, small quantities of UV absorbers can be added, for example those of the benzotriazole, benzophenone or oxalanilide types. Light stabilizers of the type of sterically hindered amines (HALS) can also be added.

To improve the storage stability in the dark, copper compounds such as copper naphthenate, copper stearate or copper octoate, phosphorus compounds such as triphenylphosphine, tributylphosphine, triethyl phosphite, triphenyl phosphite or tribenzyl phosphite, quaternary ammonium compounds such as tetramethylammonium chloride or trimethylbenzylammonium chloride or hydroxylamine derivatives, for example N-diethylhydroxylamine, can be added.

The photocurable compositions can also contain polymeric binders which are not unsaturated compounds. Examples of these are polyacrylates, cellulose esters and cellulose ethers, polyvinyl esters, vinyl chloride polymers, polyamides, polyesters, polyethers or styrene/maleic anhydride copolymers. Other customary additives are pigments, dyes, fillers, adhesion promoters, wetting agents or flow agents. For certain applications, solvents can also be added. Preferably, however, no solvents are used.

Further customary additives are photosensitizers which absorb at certain wavelengths and transmit the absorbed energy to the initiators or act themselves as an additional initiator. Examples of these are especially derivatives of thioxanthone, anthracene, anthraquinone and coumarin.

Further customary additives are accelerators of the amine type, which are of importance especially in pigmented formulations, since they act as chain transfer agents. Examples of these are N-methyldiethanolamine, triethylamine, ethyl p-dimethylaminobenzoate or Michler's ketone.

The invention therefore also relates to photocurable compositions which contain at least one ethylenically unsaturated compound and 0.5 to 20% by weight, in particular 1-5% by weight, of an initiator mixture according to claim 1.

The photocurable compositions according to the invention are suitable as coating agents for substrates of any type, for example wood, paper, ceramics, plastics such as polyester films and cellulose acetate films and metals such as copper and aluminium, where it is intended to apply a protective layer or an image by photopolymerization.

Photocuring is of great importance for printing inks, since the drying time of the binder is a critical factor in the production speed of graphical products and should be of the order of fractions of seconds. UV-curable printing inks are of importance especially for screen printing.

The photocurable mixtures according to the invention are also very suitable for the production of printing plates. Examples are solid printing plates for the printing of books and newspapers, as well as flexible printing plates for the so-called flexographic printing. In this case, for example, mixtures of soluble linear polyamides with photopolymerizable monomers, for example acrylamides, and a photoinitiator are used. Films and plates of these systems are exposed through the negative (or positive) of the print original and the uncured fractions are then eluted by means of a solvent.

A further field of use of photocuring is metal coating, for example in the painting of sheet metal for tubes, cans or bottle closures, and the photocuring of plastic coatings, for example of floor coverings or wall coverings based on PVC.

Examples of the photocuring of paper coatings are the colourless coating of labels, record sleeves or dust jackets.

The use of the photocurable compositions is also important for imaging processes and for the optical production of information carriers. In this case, the layer applied to the carrier is exposed to light through a photomask and the unexposed areas of the layer are removed by treatment with a solvent (=developer). The exposed areas are crosslinked/polymeric and therefore insoluble and remain in place on the carrier. With appropriate dyeing, visible images are formed. If the carrier is a metallized layer, the metal can, after exposure and development, be etched away from the unexposed areas or reinforced by electroplating. In this way, printed circuits and photoresists can be produced.

Light sources with a high proportion of short-wave light are especially suitable for exposure. Appropriate technical equipment and various types of lamp are nowadays available for this purpose. Examples are carbon arc lamps, xenon arc lamps, mercury vapour lamps, metal halogen lamps, fluorescent lamps, incandescent argon lamps or photographic floodlights. More recently, laser light sources have also been used. These can also be employed without photomasks; the controlled laser beam then writes directly on the photocurable layer. In the case of use as an exterior paint, curing by sunlight is also possible.

The examples which follow explain the preparation and the use of the initiator mixtures in more detail. Parts and percentages here relate to the weight, unless otherwise stated.

EXAMPLE 1: Photocuring of an acrylate mixture

All the operations are carried out under red or yellow light.
A photocurable composition is prepared by mixing
50 parts of an oligomeric urethane-acrylate (®Actilane AJ 20 from SNPE)
10 parts of trimethylolpropane triacrylate,
10 parts of dipentaerythritol monohydroxy pentaacrylate,
15 parts of tripropylene glycol diacrylate,
15 parts of N-vinylpyrrolidone and
0.5 part of a silicone-based flow assistant (®Byk 300 from Byk Mallinckrodt).

Portions of this mixture are mixed with the photoinitiators indicated in Table 1. The samples are applied in a layer thickness of 100 μm to degreased aluminium sheets (200 μm). A 76 μm thick polyester film is placed upon the liquid layer and, on top, a 21 step Stouffer test negative as a photomask as well as a second polyester film which is larger than the aluminium sheet. The resulting laminate is placed upon a metal plate provided with holes and fixed thereon by means of vacuum.

The samples are exposed for 5 seconds with a 5 kW metal halide lamp at a distance of 30 cm. After the polyester films and the test negative have been removed, the sample is developed for 15 seconds in an ethanol bath, the uncured proportions being dissolved. The sample is then dried for 5 minutes at 60° C.

The sensitivity of the initiator system used is assessed by stating the highest step on which a tack-free image has been produced. The higher the step, the more sensitive is the system. An increase by two steps here means approximately a doubling of the curing rate.

The following photoinitiators are used:
A-1 2-hydroxy-2-methyl-1-phenyl-1-propanone
A-2 1-hydroxycyclohexyl phenyl ketone
A-3 benzophenone
A-4 benzil dimethylketal
B-1 bis-(methylcyclopentadienyl)-bis-(4-decyloxy-2,3,5,6-tetrafluorophenyl)-titanium

TABLE 1

| Quantity of photoinitiator*<br>Component A | Component B | Highest image step |
| --- | --- | --- |
| 2% A-1 | — | 5 |
| 1,95% A-1 | 0,05% B-1 | 7 |
| 1,9% A-1 | 0,1% B-1 | 8 |
| 1,8% A-1 | 0,2% B-1 | 10 |
| 1% A-2 + 1% A-3 | — | 3 |
| 0,98% A-2 + 0,98% A-3 | 0,04% B-1 | 6 |
| 1% A-2 + 1% A-3 | — | 3 |
| 2% A-4 | — | 7 |
| 0,5% A-2 + 0,5% A-3 + 0,95% A-4 | 0,05% B-1 | 9 |

*relative to the photocurable composition

This shows that the combination of A and B leads to a higher sensitivity than that of the individual components or the combination of different A type initiators.

EXAMPLE 2

The procedure of Example 1 is followed, but the samples were exposed for 5 and 10 seconds.
The following photoinitiators are used:
A-5 2-hydroxy-2-methyl-1-(p-chlorophenyl)-1-propanone
A-6 2-hydroxy-2-methyl-1-(p-methoxyphenyl)-1-propanone
A-7 2-hydroxy-2-methyl-1-(p-isopropylphenyl)-1-propanone
A-8 2-dimethylamino-2-methyl-1-(p-chlorophenyl)-1-propanone
A-9 2-(3,5-dimethylmorpholino)-2-methyl-1-(p-methoxyphenyl)-1-propanone
A-10 2-dimethylamino-2-methyl-1-(p-methylthiophenyl)-1-pentanone
B-2 bis-(cyclopentadienyl)-2-trifluoromethylphenyl-titanium trifluoroacetate

TABLE 2

| Quantity of photoinitiator* | | Highest image step | |
|---|---|---|---|
| Component A | Component B | 5 sec | 10 sec |
| 2% A-5 | — | 4 | 6 |
| 1,95% A-5 | 0,05% B-2 | 6 | 8 |
| 2% A-6 | — | 2 | 4 |
| 1,95% A-6 | 0,05% B-2 | 4 | 6 |
| 2% A-7 | — | 3 | 5 |
| 1,95% A-7 | 0,05% B-2 | 5 | 7 |
| 2% A-8 | — | 0 | 1 |
| 1,95% A-8 | 0,05% B-2 | 3 | 5 |
| 2% A-9 | — | 4 | 6 |
| 1,95% A-9 | 0,05% B-2 | 5 | 7 |
| 2% A-10 | — | 3 | 6 |
| 1,95% A-10 | 0,05% B-2 | 5 | 7 |

EXAMPLE 3

The procedure of Example 2 is followed. In addition to the initiators described in Examples 1 and 2, the following photoinitiators are used:

B-3 bis-(methylcyclopentadienyl)-bis-(2,6-difluoro-3-methylphenyl)-titanium
B-4 bis-(methylcyclopentadienyl)-bis-(2,6-difluorophenyl)titanium
B-5 bis-(methylcyclopentadienyl)-2-trifluoromethylphenyltitanium trifluoroacetate
B-6 bis-(cyclopentadienyl)-bis-(2,6-difluoro-3-butoxyphenyl)titanium
B-7 bis-(cyclopentadienyl)-bis-(4-decyloxy-2,3,5,6-tetrafluorophenyl)-titanium
B-8 bis-(cyclopentadienyl)-bis[2,6-difluoro-3-(2-ethoxyethoxy)phenyl-titanium

TABLE 3

| Quantity of photoinitiator* | | Highest image step | |
|---|---|---|---|
| Component A | Component B | 5 sec | 10 sec |
| 1% A-2 + 1% A-3 | — | 3 | 5 |
| 0,975% A-2 + 0,975% A-3 | 0,05% B-1 | 6 | 8 |
| 0,975% A-2 + 0,975% A-3 | 0,05% B-2 | 6 | 8 |
| 0,975% A-2 + 0,975% A-3 | 0,05% B-3 | 7 | 10 |
| 0,975% A-2 + 0,975% A-3 | 0,05% B-4 | 7 | 10 |
| 0,975% A-2 + 0,975% A-3 | 0,05% B-5 | 5 | 7 |
| 0,975% A-2 + 0,975% A-3 | 0,05% B-6 | 9 | 12 |
| 0,975% A-2 + 0,975% A-3 | 0,05% B-7 | 8 | 11 |
| 0,975% A-2 + 0,975% A-3 | 0,05% B-8 | 9 | 12 |

*related to photocurable composition

What is claimed is:

1. A liquid photoinitiator mixture, comprising
(A) 70–99.9% by weight of at least one liquid photoinitiator of the formula I or of a liquid mixture of metal-free photoinitiators containing at least one compound of the formula I

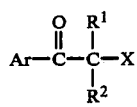
(I)

in which Ar is a phenyl group which is unsubstituted or is monosubstituted or polysubstituted by halogen, $C_1$–$C_{18}$-alkyl, $C_3$–$C_{12}$-alkenyl, $C_1$–$C_{12}$-alkoxy, allyloxy, phenoxy, $C_1$–$C_{18}$-alkylthio, allylthio, 2-hydroxyethylthio, phenylthio, tolylthio, $C_1$–$C_{12}$-alkylamino, $C_2$–$C_{24}$-dialkylamino, $C_4$–$C_8$-bis(hydroxyalkyl)-amino, diallylamino, bis-(2-methoxyethyl)amino, morpholino, piperidino or pyrrolidino, $R^1$ and $R^2$ independently of one another are $C_1$–$C_8$-alkyl or $C_1$–$C_4$-alkyl which is substituted by —OH, $C_1$–$C_4$-alkoxy, benzyloxy, —CN, —COO($C_1$–$C_8$-alkyl), ($C_1$–$C_4$-alkyl)—COO—, $C_2$–$C_8$-dialkylamino or morpholino, or $R^1$ and $R^2$ together are $C_3$–$C_9$-alkanediyl, $C_3$–$C_9$-oxa- or -aza-alkanediyl or $C_5$–$C_9$-alkenediyl, X is a group —$OR^3$ or, in which $R^3$ is hydrogen, $C_1$–$C_8$-alkyl, $C_2$–$C_4$-alkyl which is substituted by halogen, —OH or $C_1$–$C_4$-alkoxy, allyl, benzyl, 2-tetrahydropyranyl, trimethylsilyl or phenyl-dimethylsilyl, $R^4$ and $R^5$ independently of one another are hydrogen, $C_1$–$C_{12}$-alkyl, $C_2$–$C_4$-alkyl which is substituted by —OH, $C_1$–$C_4$-alkoxy, —CN or —COO($C_1$–$C_4$-alkyl), allyl, benzyl or cyclohexyl, or $R^4$ and $R^5$ together are $C_3$–$C_7$-alkylene which can be interrupted by —O— or —N($R^6$)—, $R^6$ being hydrogen, $C_1$–$C_4$-alkyl, allyl, benzyl or $C_2$–$C_4$-hydroxyalkyl, and (B) 0.5–20% by weight of at least one titanocene photoinitiator, selected from
(B$_1$) compounds of the formula II

(II)

in which $R^7$ and $R^8$ independently of one another are a cyclopentadienyl or indenyl anion which is unsubstituted or is substituted by $C_1$–$C_4$-alkyl, chlorine, phenyl or cyclohexyl, or $R^7$ and $R^8$ together are a divalent bis-cyclopentadienyl anion of the formula III

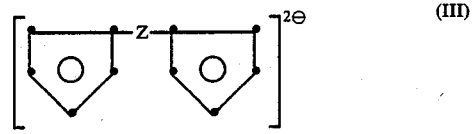
(III)

in which Z is methylene, dimethylene or trimethylene, $C_2$–$C_{12}$-alkylidene, $C_5$–$C_7$-C -cycloalkylidene, —Si($R^{11}$)($R^{12}$)— or —Sn($R^{11}$)$_2$- and $R^{11}$ and are $C_1$–$C_{12}$-alkyl, phenyl or benzyl, $R^9$ is the monovalent radical of a 6-membered carbocyclic or 5-membered or 6-membered heterocyclic aromatic ring which is substituted by fluorine in at least one ortho-position relative to the bond to the Ti atom and can also be monosubstituted or polysubstituted by halogen, $C_1$–$C_{12}$-alkyl, $C_1$–$C_{14}$-alkoxy, —O($CH_2CH_2O$)$_{1-20}$-$C_1$–$C_{14}$-alkyl, $C_2$–$C_{10}$-alkoxycarbonyl, aminocarbonyl having up to 12 C atoms or by a primary, secondary or tertiary amino or aminoalkyl group having up to 20 C atoms or a quaternary ammonium or ammonium alkyl group having up to 30 C atoms, $R^{10}$ is as defined for $R^9$ or is $C_2$–$C_{12}$-alkynyl, phenylalkynyl which has 2–5 C atoms in the alkyne radical and is unsubstituted or substituted in the phenyl radical by halogen or $C_1$–$C_{14}$-alkyl, or is halogen or a group —Si($R^{11}$)$_3$, —Si($R^{11}$)$_2$($R^{12}$), —Sn($R^{11}$)$_3$, —OH, $C_1$–$C_{10}$-alkox $C_6$–$C_{10}$-aryloxy, unsubstituted or halogen-substituted $C_2$–$C_6$-acyloxy, -N$_3$, —CN, —NCO or —NCS, or $R^9$ and $R^{10}$ together are a radical of the formula —Q—Y—Q—, in which Q is a carbocyclic or 5-membered or 6-membered heterocyclic aromatic ring which is bonded to the titanium atom in the 2-position relative to the Y group and is substituted by fluorine in the 3-position and, as further substituents, can contain $C_1$–$C_4$alkyl, halogen, $C_1$–$C_4$-alkoxy, di-($C_1$–$C_4$-alkyl)-amino or a quaternary $C_3$–$C_{20}$-ammonium group, Y is methylene, $C_2$-$C_{12}$-alkylidene, $C_5$-$C_7$-cycloalkylidene, a direct bond or a group —$NR^{13}$—, —O—, —S—, —SO—, —SO$_2$—, —CO—, —Si($R^{11}$)($R^{12}$)— or —Sn($R^{11}$)$_2$- and $R^{13}$ is hydrogen, $C_1$-$C_{12}$-alkyl, cyclohexyl, phenyl, tolyl or benzyl, or (B$_2$) compounds of the formula IV

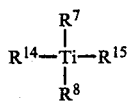
(IV)

in which $R^7$ and $R^8$ are as defined above, $R^{14}$ is the monovalent radical of a 6-membered carbocyclic or 5-membered or 6-membered heterocyclic aromatic ring which is substituted by —CF$_3$ in at least one ortho-position relative to the bond to the Ti atom and can also be monosubstituted or polysubstituted by halogen, $C_1$-$C_{12}$-alkyl, $C_1$-$C_{14}$-alkoxy, -O(CH$_2$CH$_2$O)$_{1-20}$-$C_1$-$C_{14}$-alkyl, $C_2$-$C_{10}$-alkoxycarbonyl or aminocarbonyl or by a primary, secondary or tertiary amino or aminoalkyl group having up to 20 C atoms or a quaternary ammonium or ammonium alkyl group having up to 30 C atoms, and $R^{15}$ is as defined for $R^{14}$ or is $C_2$-$C_{12}$-alkynyl, phenylalkynyl which has 2-5 C atoms in the alkyne radical and is unsubstituted or substituted in the phenyl radical by halogen or $C_1$-$C_4$-alkyl, or is halogen or a group —Si($R^{11}$)$_3$, —Si($R^{11}$)$_2$($R_{12}$), —Sn($R^{11}$)$_3$,-OH, $C_1$-$C_{10}$alkoxy, $C_6$-$C_{10}$-aryloxy, unsubstituted or halogen-substituted $C_2$-$C_6$-acyloxy, —N$_3$, —CN, —NCO or —NCS.

2. A liquid initiator mixture according to claim 1, comprising

A) 80-99.5% by weight of a liquid photoinitiator or photoinitiator mixture containing at least one compound of the formula I, in which Ar is a phenyl group which is unsubstituted or is monosubstituted or disubstituted by halogen, $C_1$-$C_{12}$-alkyl, $C_1$-$C_8$-alkoxy, allyloxy, phenoxy, $C_1$-$C_8$-alkylthio, 2-hydroxyethylthio, allylthio, phenylthio, $C_1$-$C_8$-alkylamino, $C_2$-$C_{16}$-dialkylamino, diallylamino, $C_4$-$C_6$-bis-(hydroxyalkyl)-amino, bis-(2-methoxyethyl)-amino, morpholino, piperidino or pyrrolidino, $R^1$ and $R^2$ independently of one another are $C_1$-$C_6$-alkyl or $C_1$-$C_4$-alkyl which is substituted by —OH, $C_1$-$C_4$-alkoxy, benzyloxy, —COO($C_1$-$C_4$-alkyl), $C_2$-$C_4$-dialkylamino or morpholino or $R^1$ and $R^2$ together are $C_3$-$C_6$-alkanediyl or $C_5$-$C_7$-alkenediyl, X is a group —OR$^3$ or -NR$^4$R$^5$, in which $R^3$ is hydrogen, $C_1$-$C_4$-alkyl, $C_2$-$C_4$-alkyl which is substituted by —OH or $C_1$-$C_4$-alkoxy, allyl, benzyl, 2-tetrahydropyranyl or trimethylsilyl, and $R^4$ and $R^5$ independently of one another are hydrogen, $C_1$-$C_8$-alkyl, $C_2$-$C_4$-alkyl which is substituted by —OH or $C_1$-$C_4$-alkoxy, allyl, benzyl or cyclohexyl, or $R^4$ and $R^5$ together are $C_3$-$C_7$-alkylene which can be interrupted by —O— or —N(R$^6$)—, $R^6$ being hydrogen, methyl or $C_2$-$C_4$-hydroxyalkyl, and (B) 0.5-20% by weight of a compound of the formula II, in which $R^7$ and $R^8$ are a cyclopentadienyl anion which is unsubstituted or substituted by $C_1$-$C_4$-alkyl and $R^9$ and $R^{10}$ are a group of the formula V

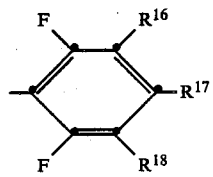
(V)

in which $R^{16}$, $R^{17}$ and $R^{18}$ independently of one another are hydrogen, F, Cl, Br, $C_1$-$C_{14}$-alkoxy, —O—(CH$_2$CH$_2$O)$_{1-8}$-$C_1$-$C_{14}$alkyl, a tertiary amino group or aminomethyl group having 2-20 C atoms or a quaternary ammonium or ammoniummethyl group having 3-24 C atoms, or $R^9$ and $R^{10}$ together are a divalent group of the formula

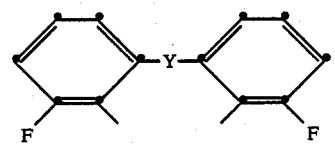

in which Y is as defined in claim 1, or 0.5-20% by weight of a compound of the formula IV, in which $R^7$ and $R^8$ are a cyclopentadienyl anion which is unsubstituted or substituted by $C_1$-$C_4$-alkyl and $R^{14}$ is a group of the formula VI

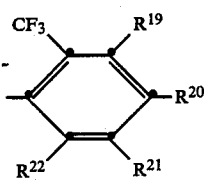
(VI)

in which $R^{19}$, $R^{20}$, $R^{21}$ and $R^{22}$ independently of one another are hydrogen, F, Cl, Br or $C_1$-$C_{14}$-alkoxy, and $R^{15}$ is as defined for $R^{14}$ or is F, Cl, Br, CN, —O—CO—CH$_3$, —O—CO—CF$_3$, N$_3$, —NCO or —NCS.

3. A liquid initiator mixture according to claim 1, wherein component A is a liquid mixture of a compound of the formula I and a compound of the formula VII

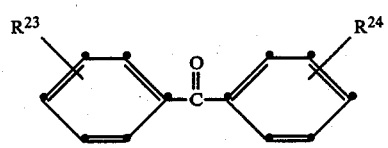
(VII)

in which and $R^{24}$ independently of one another are hydrogen, $C_1$-$C_{12}$-alkyl, $C_1$-$C_4$-alkoxy, $C_1$-$C_4$-alkylthio, $C_2$-$C_4$-hydroxyalkyloxy, $C_2$-$C_4$-hydroxyalkylthio, halogen, $C_2$-$C_{10}$-alkoxycarbonyl or $C_2$-$C_8$-dialkylamino.

4. A liquid initiator mixture according to claim 3, wherein the compounds of the formula I and of the formula VII are present in a weight ratio of 0.8:1 to 1:0.8.

5. A liquid initiator mixture according to claim 1, wherein the component A is a liquid mixture of a compound of the formula I and a 2,4,6-tri-($C_1$-$C_4$-alkyl)-benzophenone.

6. A liquid initiator mixture according to claim 1, wherein component A is a liquid mixture of a compound of the formula I and a compound of the formula VIII

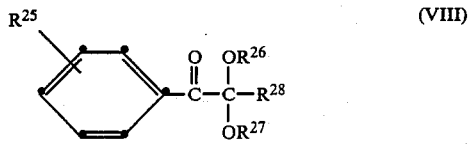
(VIII)

in which $R^{25}$ is halogen, $C_1$–$C_4$-alkyl or $C_1$–$C_4$-alkoxy, $R^{26}$ and $R^{27}$ are $C_1$–$C_6$-alkyl, $C_3$–$C_4$-alkenyl, $C_7$–$C_{10}$-phenylalkyl or $C_2$–$C_4$-alkyl which is substituted by halogen, $C_1$–$C_4$alkoxy, $C_2$–$C_8$-dialkylamino, morpholino or piperidino, or $R^{26}$ and $R^{27}$ together are $C_2$–$C_{12}$-alkanediyl or 2-butene-1,4-diyl and $R^{28}$ is hydrogen, $C_1$–$C_8$-alkyl, $C_5$–$C_8$-cycloalkyl, phenyl or phenyl which is substituted by halogen, $C_1$–$C_4$-alkyl or $C_1$–$C_4$-alkoxy.

7. A liquid initiator mixture according to claim 6, wherein the compounds of the formula I and of the formula VIII are present in a weight ratio of 2:1 to 1:2.

8. A liquid initiator mixture according to claim 1, wherein component A is a liquid mixture of one compound of the formula I, one compound of the formula VII and one compound of the formula VIII.

9. A liquid initiator mixture according to claim 1, wherein component A contains a compound of the formula I in which Ar is phenyl or phenyl which is substituted by chlorine, fluorine, $C_1$–$C_{12}$-alkyl, methoxy, methylthio, dimethylamino, diethylamino, bis-(2-methoxyethyl)-amino, morpholino, piperidino or pyrrolidino, $R^1$ and $R^2$ independently of one another are $C_1$–$C_4$-alkyl or $C_1$–$C_4$-alkyl which is substituted by —OH or $C_1$–$C_4$-alkoxy, or $R^1$ and $R^2$ together are $C_4$–$C_6$-alkanediyl or $C_5$–$C_7$-alkenediyl and X is —OH or -NR$^4$R$^5$, $R^4$ and $R^5$ being $C_1$–$C_4$-alkyl, allyl or 2-methoxyethyl or $R^4$ and $R^5$, together with the nitrogen atom, being pyrrolidino, piperidino, morpholino, piperazino or 4-methylpiperazino.

10. A liquid initiator mixture according to claim 1, wherein component A contains a compound of the formula I, in which Ar is phenyl, p-tolyl, p-cumyl, 4-dodecylphenyl, 4chlorophenyl or 4-methoxyphenyl, $R^1$ and $R^2$ independently of one another are $C_1$–$C_4$-alkyl or $R^1$ and $R^2$ together are tetramethylene or pentamethylene and X is a hydroxyl group.

11. A liquid initiator mixture according to claim 1, wherein component A contains a compound of the formula I, in which Ar is phenyl, p-tolyl, p-cumyl, 4-chlorophenyl, 4methoxyphenyl, 4-methylthiophenyl, 4-dimethylaminophenyl, 4-diethylaminophenyl, 4-bis-(2-methoxyethyl)-aminophenyl, 4morpholinophenyl or 4-piperidinophenyl, $R^1$ and $R^2$ independently of one another are $C_1$–$C_4$-alkyl and X is methylamino, dimethylamino, ethylamino, diethylamino, bis-(2-methoxyethyl)amino, piperidino, pyrrolidino, morpholino, piperazino or 4methylpiperazino.

12. A liquid initiator mixture according to claim 1, wherein component B is either a compound of the formula II, in which $R^7$ and $R^8$ are a cyclopentadienyl anion or methylcyclopentadienyl anion and $R^9$ and $R^{10}$ are a group of the formula V, in which either a) $R^{16}$ is H, F, Cl or Br, $R^{17}$ is fluorine, $C_1$–$C_{14}$-alkoxy or —O—(CH$_2$CH$_2$O)$_{1-6}$-$C_1$–$C_{14}$-alkyl and $R^{18}$ is H, Cl or Br or (b) $R^{18}$ is H, F, Cl or Br and $R^{16}$ and $R^{17}$ are H, Cl, Br, $C_1$–$C_{14}$-alkoxy, —O—(CH$_2$CH$_2$O)$_{1-6}$-$C_1$–$C_{14}$-alkyl, a tertiary amino or aminomethyl group or a quaternary ammonium or ammonium-methyl group, or B is a compound of the formula IV, in which $R^7$ and $R^8$ are a cyclopentadienyl anion or methylcyclopentadienyl anion, $R^{14}$ is 2-(trifluoromethyl)phenyl or 6-fluoro-2-(trifluoromethyl)-phenyl and $R^{15}$ is as defined for $R^{14}$ or is F, Cl, Br, CN, N$_3$, —O—CO—CH$_3$, —O—CO—CF$_3$, —NCO or —NCS.

13. A liquid initiator mixture according to claim 3, wherein component A is a liquid mixture of a compound of the formula I and benzophenone.

14. A liquid initiator mixture according to claim 1, wherein component A is a liquid mixture of a compound of the formula I and 2,2-dimethoxy-2-phenylacetophenone or 2,2-diethoxy-2-phenylacetophenone.

15. A liquid initiator mixture according to claim 1, comprising 40–50% by weight of 1-hydroxycyclohexyl phenyl ketone, 40–50% by weight of benzophenone and 2–20% by weight of a compound of the formula II or IV.

16. A liquid initiator mixture according to claim 15, comprising 40–50% by weight of 1-hydroxycyclohexyl phenyl ketone, 40–50% by weight of benzophenone and 2–20% by weight of bis-(cyclopentadienyl)-bis-(4-decyloxy)-tetrafluorophenyl)titanium.

17. A liquid initiator mixture according to claim 1, comprising 25–30% by weight of 1-hydroxycyclohexyl phenyl ketone, 25–30% by weight of benzophenone, 35–40% by weight of 2,2-dimethoxy-2-phenylacetophenone and 2–15% by weight of a compound of the formula II or IV.

* * * * *